(12) United States Patent
Kim et al.

(10) Patent No.: US 9,997,708 B2
(45) Date of Patent: Jun. 12, 2018

(54) MASK FRAME ASSEMBLY, APPARATUS AND METHOD FOR MANUFACTURING A DISPLAY APPARATUS

(71) Applicant: Samsung Display Co., Ltd., Yongin-si (KR)

(72) Inventors: Sanghoon Kim, Yongin-si (KR); Jongsung Park, Yongin-si (KR); Sangshin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days. days.

(21) Appl. No.: 15/397,328

(22) Filed: Jan. 3, 2017

(65) Prior Publication Data

US 2017/0207390 A1    Jul. 20, 2017

(30) Foreign Application Priority Data

Jan. 15, 2016    (KR) .......................... 10-2016-0005325

(51) Int. Cl.
| | |
|---|---|
| *H01L 21/00* | (2006.01) |
| *H01L 51/00* | (2006.01) |
| *C23C 14/24* | (2006.01) |
| *C23C 14/04* | (2006.01) |

(52) U.S. Cl.
CPC ........ *H01L 51/0011* (2013.01); *C23C 14/042* (2013.01); *C23C 14/24* (2013.01); *H01L 51/001* (2013.01)

(58) Field of Classification Search
CPC ... H01L 51/0011; H01L 51/001; C23C 14/24; C23C 14/042
See application file for complete search history.

(56) References Cited

U.S. PATENT DOCUMENTS

| | | | |
|---|---|---|---|
| 8,550,032 | B2 | 10/2013 | Park |
| 2010/0192856 | A1* | 8/2010 | Sung ..................... C23C 14/042 |
| | | | 118/721 |
| 2012/0279444 | A1 | 11/2012 | Hong |
| 2016/0225995 | A1* | 8/2016 | Seo ........................ C23C 14/042 |
| 2017/0141313 | A1* | 5/2017 | Min ....................... C23C 14/042 |

FOREIGN PATENT DOCUMENTS

| | | |
|---|---|---|
| KR | 10-2004-0042179 | 5/2004 |
| KR | 10-2005-0091506 | 9/2005 |
| KR | 10-2009-0053417 | 5/2009 |
| KR | 10-2011-0069466 | 6/2011 |
| KR | 10-2012-0125035 | 11/2012 |

* cited by examiner

*Primary Examiner* — Richard Booth
(74) *Attorney, Agent, or Firm* — H.C. Park & Associates, PLC

(57) ABSTRACT

A mask frame assembly includes a frame having an opening, a support bar extended in a first direction crossing the opening of the frame and having distal ends installed over the frame, and a mask having extended in a second direction crossing the first direction, having distal ends installed over the frame, and having a pattern unit extended along the second direction and configured to pass a deposition material. The support bar includes a first opening disposed on one side of the support bar and having a first width in the second direction, and a second opening disposed on the other side of the support bar opposite to the one side of the support bar and having a second width greater than the first width in the second direction.

18 Claims, 6 Drawing Sheets

MASK FRAME ASSEMBLY, APPARATUS AND METHOD FOR MANUFACTURING A DISPLAY APPARATUS

CROSS-REFERENCE TO RELATED APPLICATION

This application claims priority from and the benefit of Korean Patent Application No. 10-2016-0005325, filed on Jan. 15, 2016, which is hereby incorporated by reference for all purposes as if fully set forth herein.

BACKGROUND

Field

Exemplary embodiments relate to an apparatus and a method, and more particularly, to a mask frame assembly, an apparatus to manufacture a display apparatus, and a method of manufacturing the display apparatus.

Discussion of the Background

Mobile electronic devices, such as mobile phones, tablets, and tablet PCs are gaining wide adoption.

Since such mobile electronic devices support various functions, they include a display unit to provide a user with visual information, such as images and videos. Recently, as components of mobile electronic devices that drive the display unit have been reduced in size, the display unit has become more important and now forms a major portion of such devices. A structure, in which the display unit is bent at a predetermined angle from a flat state thereof, is being developed.

Generally, during a manufacturing process, one side of a support bar that is used to support a mask is positioned between a frame and the mask and is provided with an opening to detect pixel position accuracy (PPA) of a display apparatus. When both distal ends of the support bar are coupled to the frame while being extended, the side of the support bar is deformed due to the existence of the opening which is provided to the one side of the support bar, and thus the deformation of the support bar causes a lower deposition precision.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments relate to a mask frame assembly to resolve the above-described problems, and an apparatus and a method of manufacturing a display apparatus.

Additional aspects will be set forth in part in the description which follows and, in part, will be apparent from the description, or may be learned by practice of the presented embodiments.

An exemplary embodiment discloses a mask frame assembly including a frame having an opening, a support bar extended in a first direction crossing the opening of the frame, and having distal ends installed over the frame, and a mask extended in a second direction crossing the first direction, having distal ends installed over the frame, and having a pattern unit extended along the second direction and passing a deposition material. The support bar includes a first hole disposed on one side of the support bar and having a first width in the second direction, and a second hole disposed on the other side of the support bar opposite to the one side of the support bar and having a second width greater than the first width in the second direction.

An exemplary embodiment also discloses an apparatus to manufacture a display apparatus that includes a mask frame assembly and a deposition source disposed opposite to the mask frame assembly. The mask frame assembly includes a frame having an opening, a support bar extending in a first direction crossing the opening of the frame, and having distal ends installed over the frame, and a mask extended in a second direction crossing the first direction, having distal ends installed over the frame, and having a pattern unit extended along the second direction and passing a deposition material. The support bar includes a first hole disposed on one side of the support bar and having a first width in the second direction, and a second hole disposed on the other side of the support bar opposite to the one side of the support bar and having a second width greater than the first width in the second direction.

An exemplary embodiment further discloses a method of manufacturing a display apparatus that includes arranging a deposition source to opposite to a mask frame assembly and a substrate in order, and gasifying or vaporizing a deposition material from the deposition source such that the deposition material passes through the mask frame assembly to be deposited on the substrate. The mask frame assembly includes a frame having an opening, a support bar extending in a first direction crossing the opening of the frame, and having distal ends installed over the frame, and a mask extending in a second direction crossing the first direction, having distal ends installed over the frame, and having a pattern unit extended along the second direction and passing the deposition material. The support bar includes a first hole disposed on one side of the support bar and having a first width in the second direction, and a second hole disposed on the other side of the support bar opposite to the one side of the support bar and having a second width greater than the first width in the second direction.

It is to be understood that both the foregoing general description and the following detailed description are exemplary and explanatory and are intended to provide further explanation of the claimed inventive concepts.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
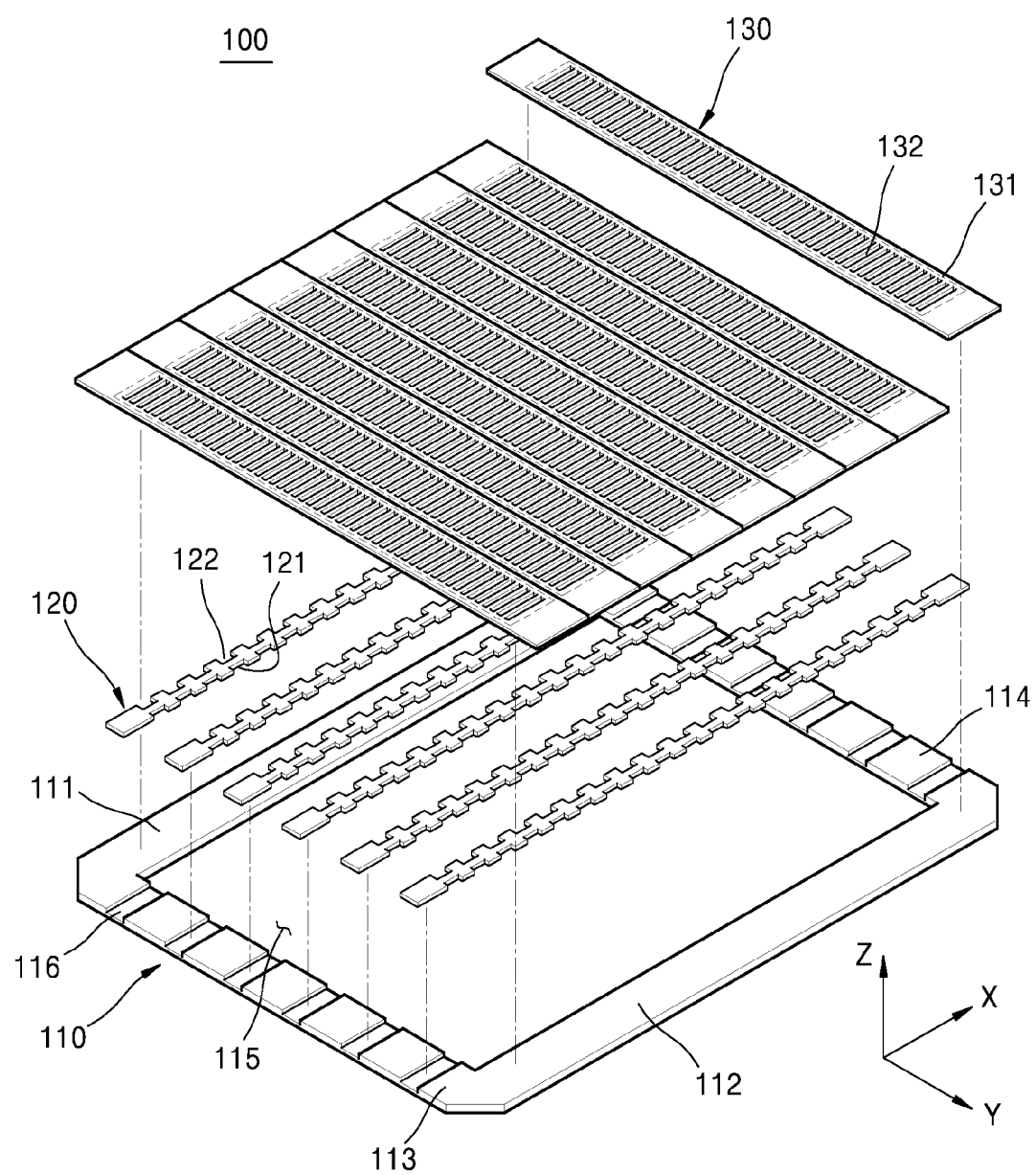
FIG. 1 is a perspective view illustrating a mask frame assembly according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Reference will now be made in detail to embodiments, examples of which are illustrated in the accompanying drawings, wherein like reference numerals refer to like elements throughout.

Figure 2:
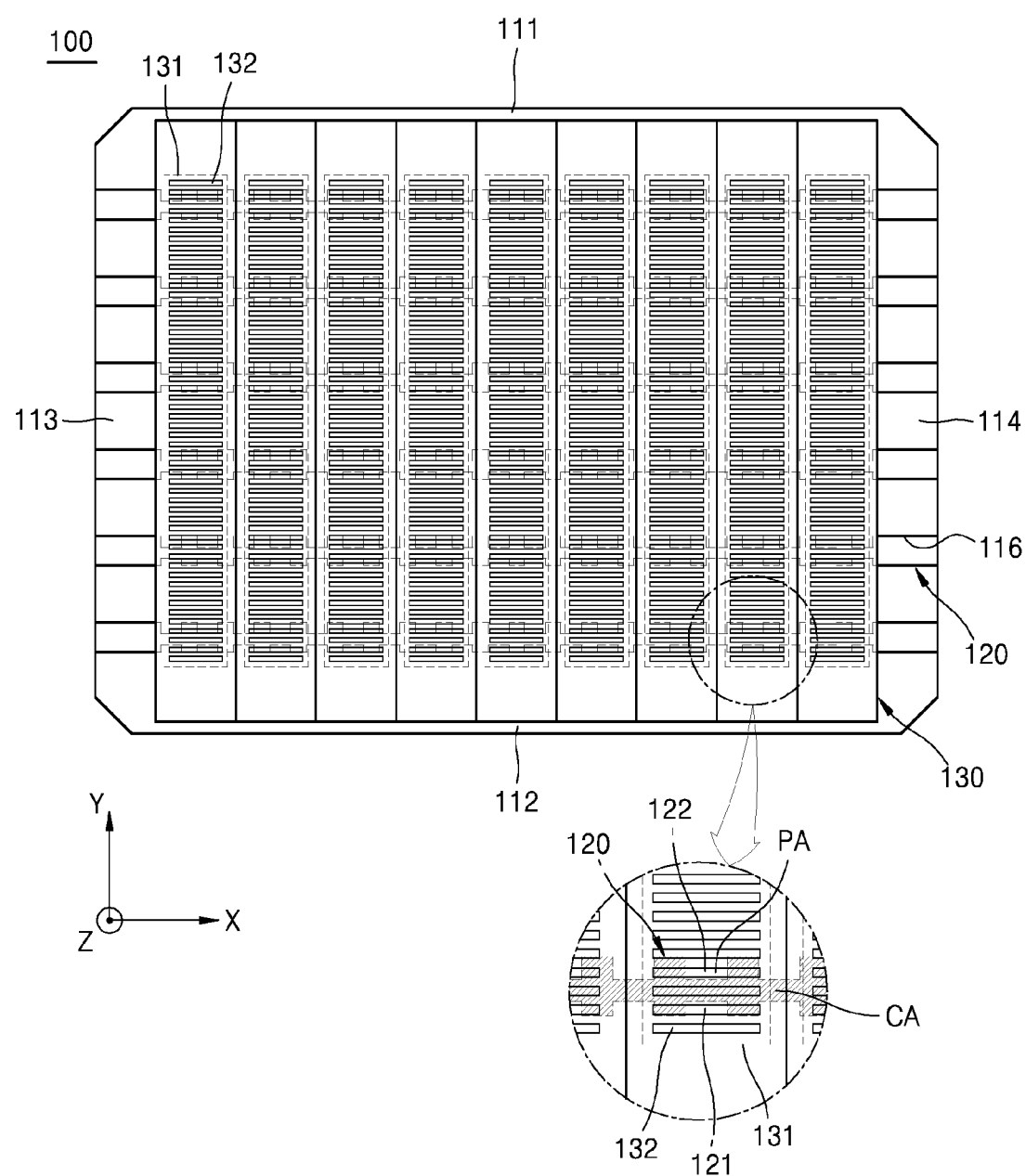
FIG. 2 is a plan view of the mask frame assembly of FIG. 1.
Figure 3:
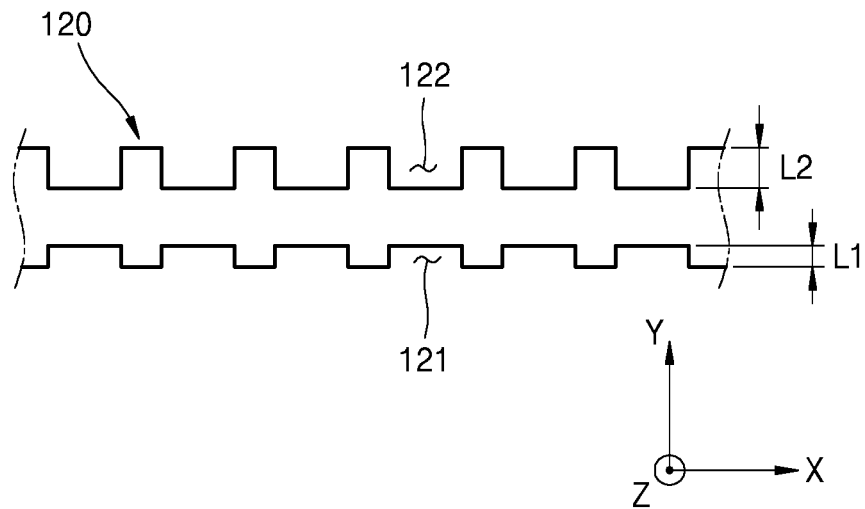
FIG. 3 is an enlarged plan view of a portion of a support bar of the mask frame assembly of FIG. 1.
Figure 4:
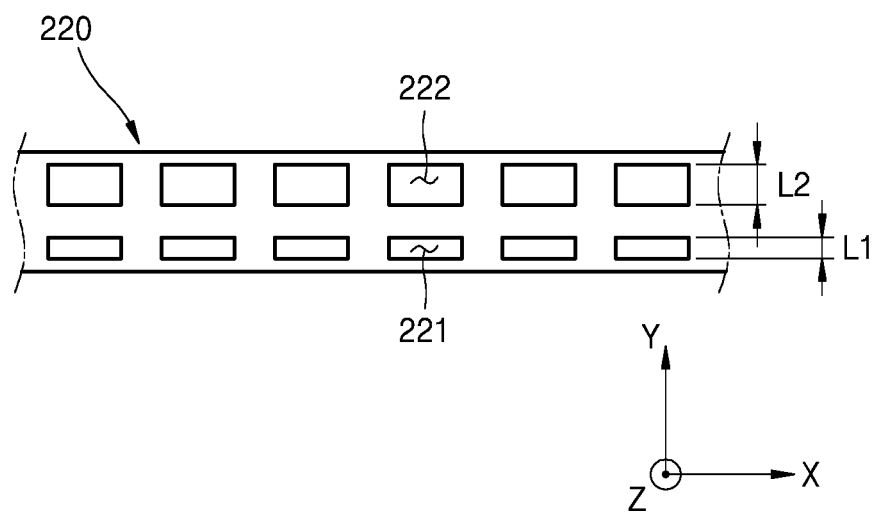
FIG. 4 is an enlarged plan view illustrating a portion of a support bar according to an exemplary embodiment.

FIG. 1 is a perspective view illustrating a mask frame assembly 100 according to an exemplary embodiment, FIG. 2 is a plan view of the mask frame assembly 100 of FIG. 1, FIG. 3 is an enlarged plan view of a portion of a support bar 120 of the mask frame assembly 100 of FIG. 1, and FIG. 4 is an enlarged plan view illustrating a portion of a support bar 220 according to an exemplary embodiment which is different from the support bar 120 of FIG. 3.

Referring to FIGS. 1 and 2, the mask frame assembly 100 may include a frame 110, the support bar 120, and a mask 130.

The frame 110 includes an opening 115 and a plurality of frame sides, namely first through fourth frame sides 111 through 114. Here, in the frame 110 illustrated in FIGS. 1 and 2, the opening 115 has a rectangular shape in a center of the frame 110. However, the present disclosure is not limited thereto. The opening 115 may include various shapes such as a circle, an ellipse, a polygon, etc. However, for convenience, a case, in which the opening 115 has the rectangular shape, will be described hereinafter.

In detail, the frame 110 may include the first frame side 111 and the second frame side 112, which are extended along an X direction and face each other in a Y direction, and the third frame side 113 and the fourth frame side 114, which are extended along the Y direction and face each other in the X direction.

The first frame side 111 and the second frame side 112 may have a first length, and the third frame side 113 and the fourth frame side 114 may have a second length which is shorter than the first length. The first, second, third, and fourth frame sides 111, 112, 113, and 114 may be connected to each other and may form a frame having a rectangular shape.

The mask 130 may include a material having a low degree of deformation, for example, a material having a high rigidity, during welding. Although not illustrated, the frame 110 includes a welding portion (not illustrated) where the frame 110, the support bar 120, and the mask 130 are welded. Since a high temperature is generated in area adjacent to the welding portion, the material of the frame 110 may include the material having the low deformation.

The support bar 120 may be installed on the frame 110 while the support bar is extended in a first direction (the X direction) crossing the opening 115 and a tensile force is applied to distal ends of the support bar 120. The support bar 120 may be coupled to the frame 110 by using various methods. The support bar 120 may be coupled to a reception groove 116 of the frame 110 by welding. However, the present disclosure is not limited thereto. The support bar 120 may be welded and coupled to the third frame side 113 and the fourth frame side 114 while being disposed on the third frame side 113 and the fourth frame side 114 rather than being disposed in the reception groove 116 of the third frame side 113 and the fourth frame side 114. For convenience, a case, in which the frame 110 includes the reception groove 116 and the support bar 120 is coupled to the reception groove 116, will be explained in detail.

Referring to FIG. 3, the support bar 120 may include a first opening 121 which is formed on one side of the support bar 120 and has a first width L1 in a second direction (the Y direction) crossing the first direction, and a second opening 122 which is formed on the other side of the support bar 120 being opposite to the one side of the support bar 120 and has a second width L2 in the second direction. The second width L2 of the second opening 122 may be twice the first width L1 of the first opening 121.

The first opening 121 and the second opening 122 may be disposed in the second direction to be symmetrical to each other. As illustrated in FIG. 3, the first opening 121 and the second opening 122 may be recessed from an outermost of the corresponding side of the support bar 120. Moreover, as illustrated in FIG. 4, the first opening 121 and the second opening 122 may be formed inside the support bar 120 as a hole.

The support bar 120 may cover a blocking area CA of a pattern unit 131 of the mask 130, which will be described later, and prevent a deposition material from passing the blocking area CA of the pattern unit 131.

Generally, in order to prevent deflection of the support bar 120 by its own weight, the support bar 120 may be coupled to the frame 110 while both the distal ends of the support bar 120 are extended. Here, the first opening 121 of the support bar 120 is an opening element to measure pixel position accuracy of the deposition material which is deposited on a substrate (not illustrated) through the mask frame assembly 100.

If the support bar 120 includes the first opening 121 only, the one side of the support bar 120, on which the first opening 121 is formed, may be deformed relatively greater than the other side of the support bar 120 in which the first opening 121 is not formed, when the support bar 120 is extended. When the support bar 120 is deformed as described above, the deposition material may unintentionally pass through the blocking area CA of the mask 130 during a deposition process using the mask frame assembly, a shadow effect may happen according to the deposition material which is deposited on an outside area of a deposition area of a substrate, and a display apparatus manufactured by using the mask frame assembly 100 may have a defect which causes poor reliability.

On the other hand, when the deposition process is performed by using the frame mask assembly 100 according to the present exemplary embodiment, that is, the deposition is performed by using the frame mask assembly 100 including the support bar 120 having the second opening 122 which is symmetrical to the first opening 121, the above-described problems may be resolved and the deformation of the support bar 120 may be prevented, by dispersing the tensile force which is applied to the sides of the support bar 120 corresponding to the first opening 121 and the second opening 122.

In detail, the support bar 120 may have a structure, in which the second width L2 of the second opening 122 is two times the first width L1 of the first opening 121, according to experimental results, and thus, the deformation of the support bar 120 may be reduced by using the above-described structure.

The mask 130 is extended in the second direction crossing the first direction and then both distal ends of the mask 130 are installed on the frame 110. The mask 130 may include the pattern unit 131 which is extended along the second direction and through which the deposition material passes.

The mask 130 may be a bar mask which is divided in plural elements. The pattern unit 131 may include a plurality of pattern holes 132 through which the deposition material passes according to a predetermined pattern. The plurality of pattern holes 132 may be continuously arranged along the second direction which is a lengthwise direction of the mask 130. The deposition material passing through the plurality of pattern holes 132 is deposited on a substrate (not illustrated), and thus the deposition area is defined in the substrate.

In more detail, since the pattern unit 131 is covered by the support bar 120, the mask frame assembly may include the blocking area, which blocks the deposition material moving toward the substrate from a deposition source (not illustrated) during the deposition process, and a passing area (PA) which allows the deposition material to pass therethrough during the deposition process.

Meanwhile, the mask 130 may be manufactured by using an etching method. The mask 130 may be manufactured by forming on a thin film a photoresist layer having the same pattern as each of the plurality of pattern holes 132 using a photoresist or attaching to a thin film having the same pattern as each of the plurality of pattern holes 132, and then by etching the thin film. Moreover, the mask 130 may be manufactured according to an electro-forming method or an electroless plating method.

The number, arranging position, and a shape of the plurality of pattern holes 132 are illustrated as an example in the drawings. For example, the plurality of pattern holes 132 may have a masking pattern in which a front is open, or may have a mask pattern of a stripe shape.

The mask 130 may be a magnetic thin film and may include stainless steel, Invar, nickel, cobalt, a nickel alloy, a nickel-cobalt alloy, etc. The mask may include the nickel-cobalt alloy in which a fine pattern is easily formed and which has an excellent surface roughness.

Figure 5:
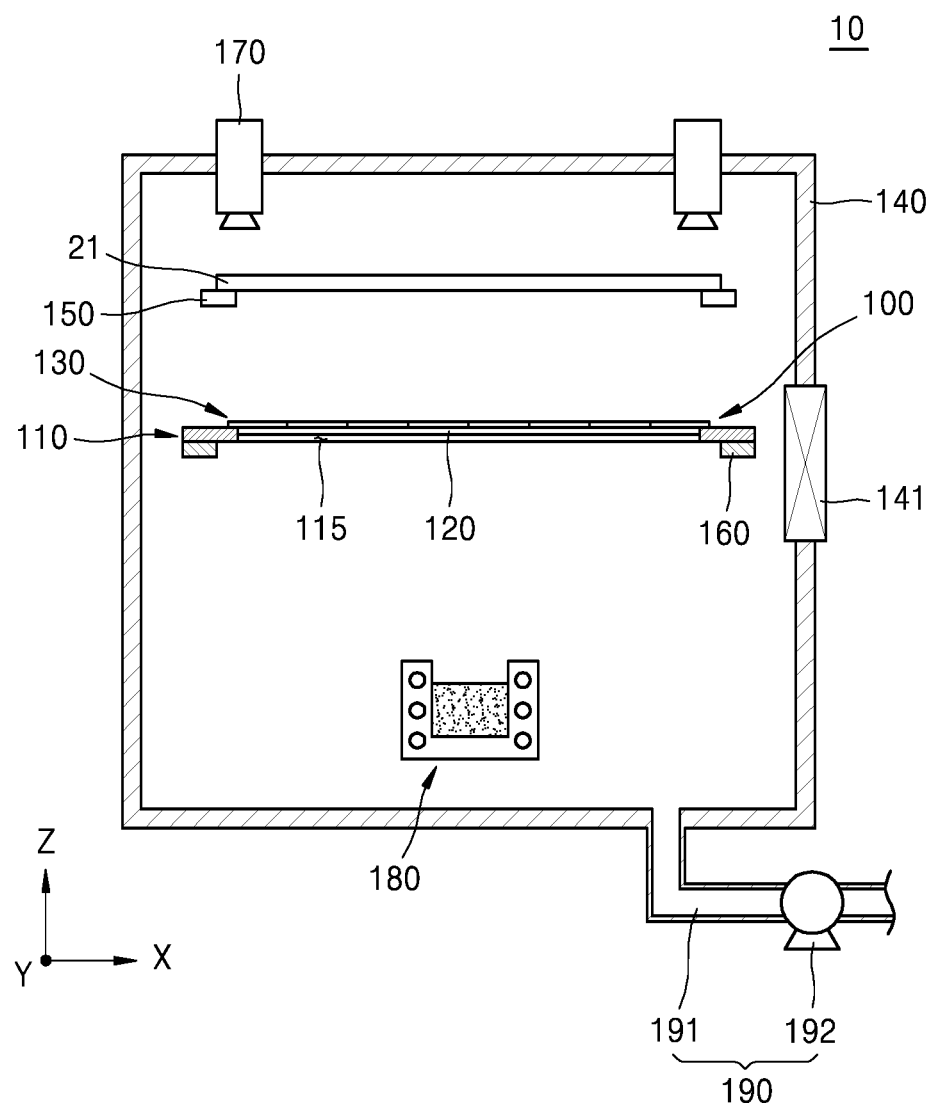
FIG. 5 is a cross-sectional view schematically illustrating an apparatus to manufacture a display apparatus by using the mask frame assembly of FIG. 1.

FIG. 5 is a cross-sectional view schematically illustrating an apparatus 10 to manufacture a display apparatus by using the mask frame assembly 100 of FIG. 1.

Referring to FIG. 5, the manufacturing apparatus 10 to manufacture the display apparatus may include a mask frame assembly 100 having a frame 110, a support bar 120, a mask 130, a chamber 140, a substrate support 150, a frame support 160, a vision unit 170, a deposition source 180, and a suction unit 190.

The mask frame assembly 100 may be the same as or similar to the embodiment illustrated in FIGS. 1 through 4, and thus detail descriptions thereof will be omitted.

The chamber 140 may include an internal space and may have a portion to be open to outside. Here, a gate valve 141 may be installed in the portion of the chamber 140. The gate valve 141 may close or open the portion of the chamber 140.

The substrate support 150 may support a substrate 21. Here, the substrate support 150 may include various shapes. For example, the substrate support 150 may include a shuttle, an electro-static chuck, etc., inside the chamber 140. In another embodiment, an additional support frame may be included inside the chamber 140. However, for convenience, a case, in which the substrate support 150 includes the additional support frame, will be explained in detail hereinafter.

The deposition material may be deposited on a plurality of deposition areas which are spaced-apart from each other on the substrate 21. That is, as described above, the deposition material, which passes through the passing area PA of the pattern unit 131, is deposited on the substrate 21. And thus, an area of the substrate 21, in which the deposition material is deposited, may be defined based on an area of the substrate 21 corresponding to the blocking area CA. After the deposit process is performed on the substrate 21, the substrate 21 may be divided into a plurality of substrates to form a plurality of display apparatuses (not illustrated).

The frame support 160 may be between the substrate support 150 and the deposition source 180. Here, the mask frame assembly 100 may be disposed on and supported by the frame support 160. The frame support 160 may align the mask frame assembly 100 and the substrate 21 by changing a displacement of the mask frame assembly 100 with respect to the substrate 21 within a small range.

The vision unit 170 may include a camera. Here, the vision unit 170 captures a location of the mask frame assembly 100 and the substrate 21 and provides the manufacturing apparatus 10 with data necessary to align the substrate 21 and the mask frame assembly 100.

The deposition material may be inside the deposition source 180. Here, the deposition material may be a vaporizable material, and may include at least one of an inorganic material, a metal, or an organic material. However, for convenience, a case, in which the deposition material includes the organic material, will be explained in detail hereinafter.

The suction unit 190 may be connected to the chamber 140 and may maintain a constant pressure inside the chamber 140. Here, the suction unit 190 may include a connecting pipe 191 connected to the chamber 140 and a pump 192 installed at the connecting pipe 191.

In an operation of the apparatus 10 to manufacture the display apparatus, the gate valve 141 is open such that the chamber 140 is open. Here, the suction unit 190 may control a pressure of an inside of the chamber 140 to be similar to an atmospheric pressure.

When the gate valve 141 is open, the substrate 21 and the mask frame assembly 100 are inserted into the inside of the chamber 140 from outside. Here, a robot arm or the shuttle may move the substrate 21 and the mask frame assembly 100.

When the substrate 21 and the mask frame assembly 100 are inserted into the inside of the chamber 140, the gate valve 141 is operated to close the chamber 140, and then the suction unit 190 is operated to maintain the pressure of the inside of the chamber 140 to maintain a substantially vacuum state. In addition, the deposition material is vaporized or sublimed from the deposition source 180, and then the deposition material passes through the pattern holes 132 of the mask frame assembly 100 to be deposited on the substrate 21 as predetermined patterns.

Figure 6:
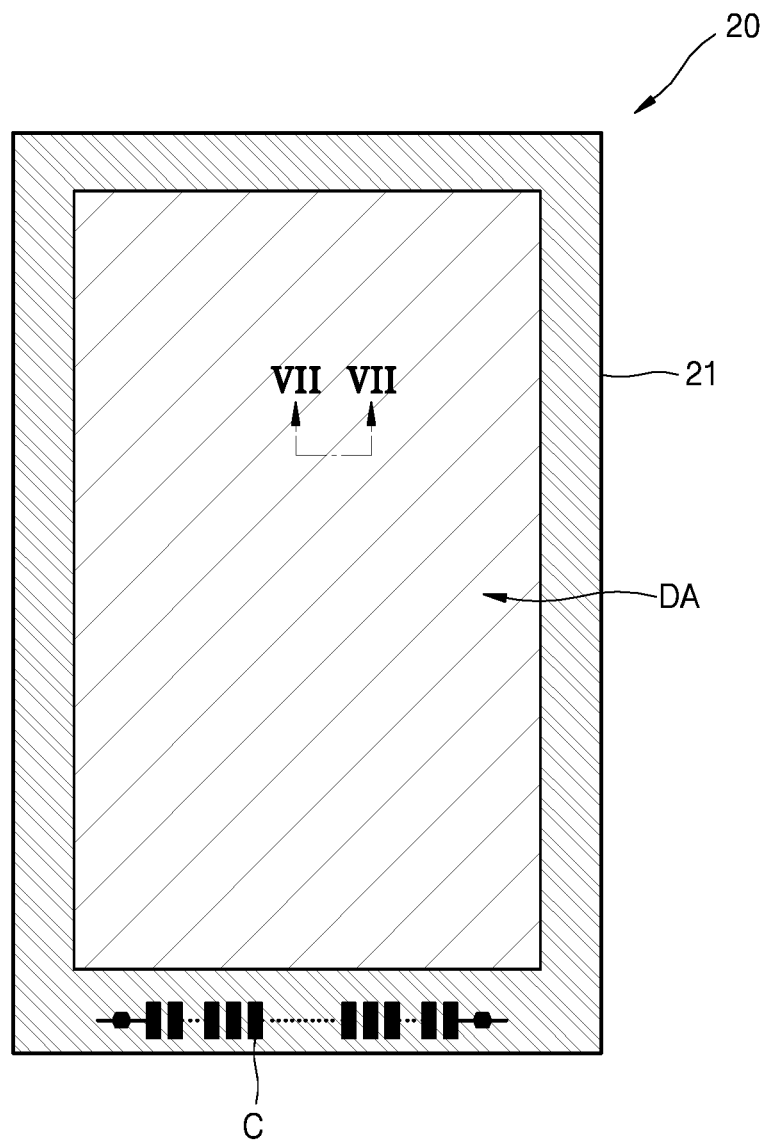
FIG. 6 is a plan view schematically illustrating the display apparatus manufactured by the manufacturing apparatus of FIG. 5.
Figure 7:
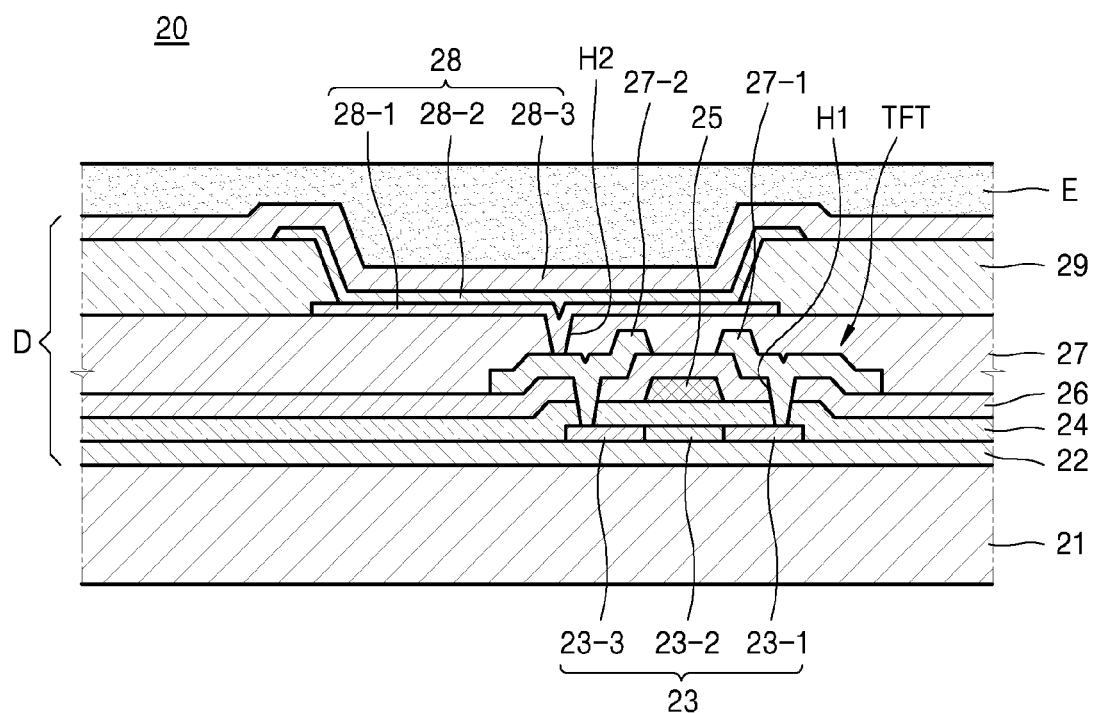
FIG. 7 is a cross-sectional view taken along a line V-V of FIG. 6.

FIG. 6 is a plan view schematically illustrating a display apparatus 20 manufactured by the manufacturing apparatus 10 of FIG. 5, and FIG. 7 is a cross-sectional view taken along a line V-V of FIG. 6.

Referring to FIGS. 6 and 7, the display apparatus 20 includes a display area DA over a substrate 21 and a non-display area outside the display area DA. An emission element D may be disposed in the display area DA, and a wiring (not illustrated) may be disposed in the non-display area. Also, a pad unit C may be disposed in the non-display area.

The display apparatus 20 may include the substrate 21 and the emission element D. The display apparatus 20 may include an encapsulating layer E over an upper portion of the emission element D. Here, the substrate 21 may include a plastic material or a metal, such as steel use stainless (SUS), titanium (Ti), etc. Also, the substrate 21 may include polyimide (PI). For convenience, a case, in which the substrate 21 includes the PI, will be explained in detail hereinafter.

The emission element D may be disposed on the substrate 21. Here, the emission element D may include a thin film transistor TFT, a passivation film 27 to cover the thin film transistor TFT, and an organic light-emitting device (OLED) 28 over the passivation film 27.

Here, the substrate 21 may include a glass material. However, the present disclosure is not limited thereto. The substrate 21 may include a plastic material or a metal such as SUS, Ti, etc. Also, the substrate 21 may include the PI. For convenience, a case, in which the substrate 21 includes a glass material, will be explained in detail hereinafter.

A buffer layer 22 may be disposed on an upper surface of the substrate 21 and may include an organic compound and/or an inorganic compound. The buffer layer 22 may include silicon oxide ($SiO_X$) where x≥1 or silicon nitride ($SiN_X$) where X≥1.

After an active layer 23 is formed as a plurality of patterns which are arranged over the buffer layer 22, the active layer 23 is buried by a gate insulating layer 24. The active layer 23 may include a source area 23-1, a drain area 23-3, and a channel area 23-2 between the source area 23-1 and the drain area 23-3.

The active layer 23 may include various materials. For example, the active layer 23 may include an inorganic semiconductor material, such as amorphous silicon or crystal silicon. In another embodiment, the active layer 23 may include an organic semiconductor material. However, for convenience, a case, in which the active layer 23 includes amorphous silicon, will be explained in detail hereinafter.

The active layer 23 may be formed by forming the amorphous silicon over the buffer layer 22, crystalizing the amorphous silicon to form a polycrystalline, and patterning the polycrystalline. The active layer 23 may include the source area 23-1 and the drain area 23-3 which are formed by doping the active layer 23 with impurities according to a kind of the thin film transistor TFT, such as a driving thin film transistor (not illustrated) and a switching thin film transistor.

A gate electrode 25 is formed over the gate insulating layer 24 to correspond to the active layer 23, and then an interlayer insulating layer 26 is formed to bury the gate electrode 25.

After a contact hole H1 is formed in the interlayer insulating layer 26 and the gate insulating layer 24, a source electrode 27-1 and a drain electrode 27-2 are formed over the interlayer insulating layer 26 and contact the source area 23-1 and the drain area 23-3, respectively.

A passivation film 27 is formed over the thin film transistor TFT, and a pixel electrode 28-1 of the organic light-emitting device OLED is formed over the passivation film 27. The pixel electrode 28-1 contacts the drain electrode 27-2 of the thin film transistor TFT through a via hole H2 which is formed in the passivation film 27. The passivation film 27 may include an inorganic material, an organic material, a single layer, or a multilayer having two or more layers. The passivation film 27 may be a planarization film having a flat upper film surface regardless of a curved lower film surface thereof. However, the passivation film 27 may have a curved upper film surface according to the curved lower film surface. And, the passivation film 27 may include a transparent insulating material to attain resonance effects.

After the pixel electrode 28-1 is formed over the passivation film 27, a pixel defining film 29 is formed to cover the pixel electrode 28-1 and the passivation film 27 and includes an organic material and/or an inorganic material, and is open to expose the pixel electrode 28-1 to outside.

An intermediate layer 28-2 and an opposite electrode 28-3 are formed over the pixel electrode 28-1.

The pixel electrode 28-1 may function as an anode and the opposite electrode 28-3 may function as a cathode. It is possible that polarities of the pixel electrode 28-1 and the opposite electrode 28-3 may be reversed.

The pixel electrode 28-1 and the opposite electrode 28-3 may be insulated from each other by the intermediate layer 28-2, and voltages with different polarities are applied to the intermediate layer 28-2 such that light is emitted from an organic emission layer.

The intermediate layer 28-2 may include the organic emission layer. In another exemplary embodiment, the intermediate layer 28-2 may include the organic emission layer and additionally include at least one of a hole injection layer (HIL), a hole transport layer (HTL), an electron transport layer (ETL), and an electron injection layer (EIL). However, the present disclosure is not limited thereto. The intermediate layer 28-2 may include the organic emission layer and additionally include various functional layers (not illustrated).

Here, the intermediate layer 28-2 may be formed an apparatus (not illustrated) to manufacture the display apparatus 20 described above.

Meanwhile, a unit pixel may include a plurality of sub-pixels, and the plurality of sub-pixels may respectively emit various different colors of light. For example, the plurality of sub-pixels may include sub-pixels respectively emitting a red color light, a green color light, and a blue color light or sub-pixels respectively emitting the red color light, the green color light, the blue color light, and a white color light.

Meanwhile, the encapsulating layer E may include a plurality of inorganic layers or may include an inorganic layer and an organic layer.

The organic layer of the encapsulating layer E may include a polymer. The organic layer of the encapsulating layer E may include a single film or a stack film including at least one of polyethylene terephthalate, polyimide, polycarbonate, epoxy, polyethylene, and polyacrylate. The organic layer of the encapsulating layer E may include polyacrylate. The organic layer of the encapsulating layer E may include a diacrylate-based monomer or a polymerized monomer compound including the diacrylate-based monomer. A monoacrylate-based monomer may be added to the monomer compound. Also, a photoinitiator, such as TPO, may be added to the monomer compound. However, the present disclosure is not limited thereto.

The inorganic layer of the encapsulating layer E may include a single film or a stack film including metal oxide or metal nitride. The inorganic layer of the encapsulating layer E may include one of silicon nitride ($SiN_x$), aluminum oxide ($Al_2O_3$), silicon oxide ($SiO_2$), and titanium oxide ($TiO_2$).

An uppermost layer of the encapsulating layer E may include an inorganic layer to prevent introduction of moisture into the organic light-emitting device (OLED).

The encapsulating layer E may include at least one sandwich structure in which at least one organic layer is inserted into at least two inorganic layers. In another embodiment, the encapsulating layer E may include at least one sandwich structure in which at least one inorganic layer is inserted into at least two organic layers. In another embodiment, the encapsulating layer E may include at least one sandwich structure in which at least one organic layer is inserted into at least two inorganic layers, and at least one sandwich structure in which at least one inorganic layer is inserted into at least two organic layers.

The encapsulating layer E may include a first inorganic layer, a first organic layer, and a second inorganic layer, which are disposed in order from an upper portion of the organic light-emitting device (OLED).

In another exemplary embodiment, the encapsulating layer E may include a first inorganic layer, a first organic layer, a second inorganic layer, a second organic layer, and a third inorganic layer, which are disposed in order from the upper portion of the organic light-emitting device (OLED).

In another exemplary embodiment, the encapsulating layer E may include a first inorganic layer, a first organic layer, a second inorganic layer, a second organic layer, a third inorganic layer, a third organic layer, and a fourth inorganic layer, which are disposed in order from the upper portion of the organic light-emitting device (OLED).

A halogenated metal layer including lithium fluoride (LiF) may be added between the organic light-emitting device (OLED) and the first inorganic layer of the encapsulating layer E. the halogenated metal layer may prevent damage of the organic light-emitting device (OLED) during forming the first inorganic layer by using a sputtering method.

An area of the first organic layer may be smaller than an area of the second inorganic layer, and an area of the second organic layer may be smaller than an area of the third inorganic layer.

Accordingly, since the display apparatus 20 includes the intermediate layer 28-2 having a precise pattern and the intermediate layer 28-2 is deposited and formed at an accurate location of the display apparatus 20, a precise image may be realized in the display apparatus. Moreover, the display apparatus 20 maintains a constant pattern to have a uniform quality in continuing productions when the intermediate layer 28-2 is repeatedly deposited in the display apparatus 20.

It should be understood that embodiments described herein should be considered in a descriptive sense only and not for purposes of limitation. Descriptions of features or aspects within each embodiment should typically be considered as available for other similar features or aspects in other embodiments.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A mask frame assembly, comprising:
a frame comprising an opening;
a support bar extended in a first direction crossing the opening of the frame, and comprising distal ends installed over the frame; and
a mask extended in a second direction crossing the first direction, comprising distal ends installed over the frame, and comprising a pattern unit extended along the second direction and configured to pass a deposition material,
wherein the support bar comprises:
a first opening disposed on one side of the support bar, and having a first width in the second direction; and
a second opening disposed on the other side of the support bar opposite to the one side of the support bar, and having a second width greater than the first width in the second direction.

2. The mask frame assembly of claim 1, wherein the frame comprises reception grooves configured to respectively receive the distal ends of the support bar.

3. The mask frame assembly of claim 1, wherein the support bar is configured to cover a blocking area of the pattern unit to block the deposition material from passing through the blocking area of the pattern unit.

4. The mask frame assembly of claim 1, wherein the second width of the second opening is two times the first width of the first opening.

5. The mask frame assembly of claim 1, wherein the first opening and the second opening are symmetrical to each other in the second direction.

6. The mask frame assembly of claim 1, wherein the first opening and the second opening are respectively recessed from an outermost of the one side of the support bar and an outermost of the other side of the support bar.

7. The mask frame assembly of claim 1, wherein the first opening and the second opening are disposed in an inside of the support bar.

8. The mask frame assembly of claim 1, wherein:
the mask comprises a plurality of masks; and
the plurality of masks are continuously arranged in the first direction.

9. The mask frame assembly of claim 1, wherein:
the pattern unit comprises a plurality of pattern holes configured to pass the deposition material according to a predetermined pattern; and
the plurality of pattern holes are continuously arranged in the second direction.

10. An apparatus to manufacture a display apparatus, comprising:
a mask frame assembly; and
a deposition source disposed opposite to the mask frame assembly,
wherein the mask frame assembly comprises:
a frame comprising an opening;
a support bar extended in a first direction crossing the opening of the frame, and comprising distal ends installed over the frame; and
a mask extended in a second direction crossing the first direction, comprising distal ends installed over the frame, and comprising a pattern unit extended along the second direction and configured to pass a deposition material,
wherein the support bar comprises:
a first opening disposed on one side of the support bar, and having a first width in the second direction; and
a second opening disposed on the other side of the support bar opposite to the one side of the support bar, and having a second width greater than the first width in the second direction.

11. The apparatus of claim 10, wherein the frame comprises reception grooves configured to respectively receive the distal ends of the support bar.

12. The apparatus of claim 10, wherein the support bar is configured to cover a blocking area of the pattern unit to block the deposition material from passing through the blocking area of the pattern unit.

13. The apparatus of claim 10, wherein the second width of the second opening is two times the first width of the first opening.

14. The apparatus of claim 10, wherein the first opening and the second opening are symmetrical to each other in the second direction.

15. The apparatus of claim 10, wherein the first opening and the second opening are respectively recessed from an outermost of the one side of the support bar and an outermost of the other side of the support bar.

16. The apparatus of claim 10, wherein the first opening and the second opening are disposed in an inside of the support bar.

17. The apparatus of claim 10, wherein the mask is a plurality of masks which are continuously arranged in the first direction.

18. The apparatus of claim 10, wherein:
the pattern unit comprises a plurality of pattern holes configured to pass the deposition material according to a predetermined pattern; and
the plurality of pattern holes are continuously arranged in the second direction.

* * * * *